United States Patent [19]

LaBianca

[11] Patent Number: 4,806,455
[45] Date of Patent: Feb. 21, 1989

[54] THERMAL STABILIZATION OF PHOTORESIST IMAGES

[75] Inventor: Nancy C. LaBianca, Yalesville, Conn.

[73] Assignee: MacDermid, Incorporated, Waterbury, Conn.

[21] Appl. No.: 34,344

[22] Filed: Apr. 3, 1987

[51] Int. Cl.⁴ .............................................. G03C 5/00
[52] U.S. Cl. .................................. 430/325; 430/324; 430/326; 427/57; 427/425
[58] Field of Search .................. 430/3, 325, 326, 324; 427/27, 30, 425, 57, 421, 424

[56] References Cited

U.S. PATENT DOCUMENTS

| | | | |
|---|---|---|---|
| 2,992,919 | 7/1961 | Beeler et al. | 101/466 R |
| 3,459,128 | 8/1969 | Erdmann et al. | 430/23 |
| 4,659,014 | 4/1987 | Soth et al. | 239/102.2 |
| 4,701,390 | 10/1987 | Grunwald et al. | 430/325 |

Primary Examiner—José G. Dees
Attorney, Agent, or Firm—St. Onge Steward Johnston & Reens

[57] ABSTRACT

Application of a high temperature resistant film forming polymer has previously proved successful in stabilizing photoresist image layers, particularly those used for high resolution geometries in microelectronic applications, against distortion or degradation by the heat generated during subsequent etching, ion implantation processes and the like. It has been found that, when the thickness of the photoresist image layer exceeds about 1 micron, the coating of the film forming polymer tends to distort and/or cause cracks, breaks and the like in the photoresist resulting in loss of the required geometry in the image. In accordance with the invention this problem can be overcome by applying the film forming polymer in the form of an ultrasonically atomized spray under controlled conditions.

5 Claims, 1 Drawing Sheet

THERMAL STABILIZATION OF PHOTORESIST IMAGES

CROSS-REFERENCE TO RELATED APPLICATIONS

This application is directed to an invention which is closely related to that described in copending application Ser. No. 879,385 filed June 27, 1986 U.S. Pat. No. 4,762,768, which is a continuation-in-part of application Ser. No. 823,942 filed Jan. 29, 1986, now abandoned, which latter is a continuation-in-part of copending application Ser. No. 802,514 filed Nov. 27, 1985 U.S. Pat. No. 4,701,390. All of these earlier applications and the present application are commonly assigned.

BACKGROUND OF THE INVENTION

1. Field of the Invention

This invention relates to an improved process for thermally stabilizing photoresist images and is more particularly concerned with the thermal stabilization of photoresist images having high resolution geometries for use in microelectronic applications.

2. Description of the Prior Art

In the aforementioned commonly assigned prior applications Ser. No. 802,514 now U.S. Pat. No. 4,701,390; 823,942; and 879,385 now U.S. Pat. No. 4,762,768 there are described processes for thermally stabilizing photoresist images such as those employed in the fabrication of microelectronic circuitry on chips, wafers and the like particularly such images having high resolution geometries. In the '514 application the thermally stabilizing agents are inclusive of fluorocarbon surfactants, hydroxyl group containing polymers, chromium sulfate, trichloroacetic acid, chromotropic acid and salts of the latter acids. In the '942 and '385 applications the thermal stabilization is accomplished by applying a film of a high temperature resistant film forming polymer of which hydrolyzed collagens such as gelatin and non-gelling hydrolyzed gelatins are preferred examples.

The processes of these prior applications have been found to give satisfactory results when employed with photoresist layers having a thickness of about 1 micron or less. However, when the thickness of the photoresist layer exceeds about 1 micron, it has been found that the coating of the thermally stabilizing agent can cause distortion of the photoresist image to which it has been applied. Cracks, breaks and like flaws in the image can result and, in some cases, the image may lose adhesion to the substrate and show a tendency to peel off. Any and all of these phenomenon can impair or destroy the high resolution geometry required in the photoresist image without which the desired final microcircuitry cannot be successfully produced.

It has been found that photoresist images which have thicknesses substantially in excess of about 1 micron can be thermally stabilized by a modification of the processes described in the aforesaid prior applications.

SUMMARY OF THE INVENTION

It is an object of the invention to provide high resolution photoresist images which, regardless of the thickness thereof, will withstand exposure to elevated temperatures up to about 220° C. during post-imaging processes without suffering significant distortion or other deterioration of the image profile.

It is a further object of the invention to provide a simple, relatively inexpensive, process for treating a high resolution photoresist image after development and preferably prior to post-development bake whereby the image, regardless of its thickness, is stabilized against distortion or other forms of degradation in subsequent post-imaging processes.

It is yet another object of the invention to provide a process for thermally stabilizing a high resolution photoresist image on a substrate without significantly affecting the ease of subsequently stripping said photoresist from the substrate.

These objects, and other objects which will become apparent from the description which follows, are achieved by the process of the invention. The latter, in its broadest aspect, comprises an improved process for thermally stabilizing a resist image supported on a substrate by coating the image with a film of thermally stabilizing material wherein the improvement comprises applying the stabilizing material in the form of atomized droplets generated using an ultrasonic nozzle and falling under gravity from the nozzle while the latter and the substrate are being moved relative to each other.

The improved process of the invention can be utilized to thermally stabilize any type of photoresist image supported by a substrate. It is particularly advantageous when utilized to treat high resolution positive photoresist images having thicknesses of the order of 1 micron or higher supported on substrates such as silicon, silicon oxide, metals, nitrides, phosphides and the like. In a particularly preferred embodiment of the improved process of the invention the latter is employed to thermally stabilize a high resolution positive photoresist image which has been prepared using a photoresist system based on a novolac resin.

DETAILED DESCRIPTION OF THE INVENTION

Figure 1:
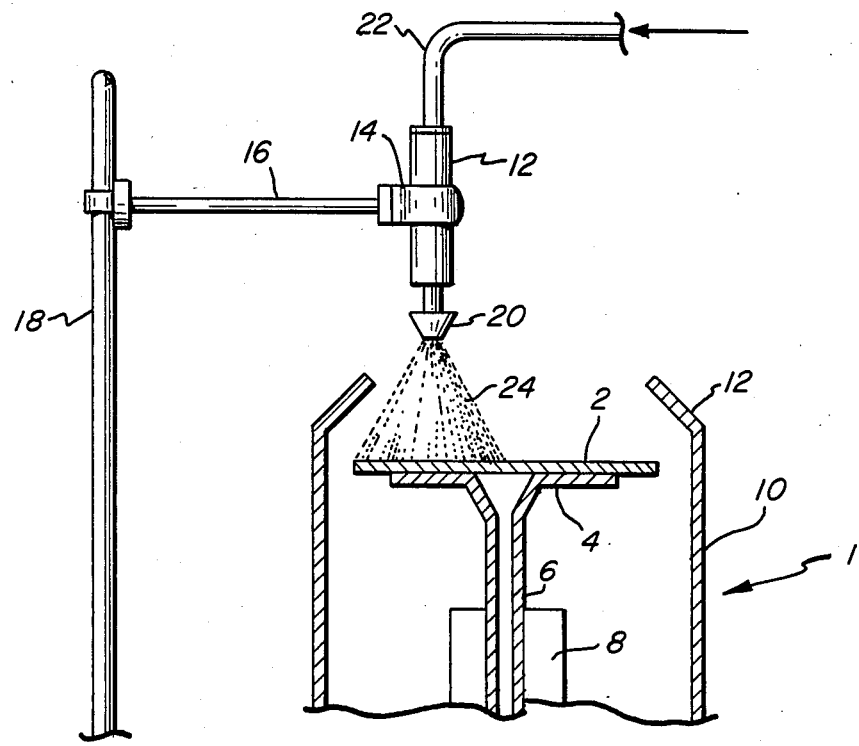
FIG. 1 is a side elevation view, partly in cross-section, illustrating one embodiment of a process in accordance with the invention.

As previously set forth, the process described in the aforesaid commonly assigned prior applications '514, '942 and '385 can give rise to problems when employed to thermally stabilize photoresist images having a thickness equal to or greater than about 1 micron. It has been found, surprisingly, that these problems (distortion, cracks, breaks, peeling of the image) appear to be due principally to the method of application of the thermally stabilizing material to the image. Thus, problems are encountered when the thermally stabilizing material is applied to photoresist images having thicknesses substantially or greater than about 1 micron by any of a variety of conventional techniques such as dip coating, roller coating, pressurized spray coating and spin coating.

It has been found that the above problems can be overcome by using a particular technique in the application of the thermally stabilizing material to the photoresist image. The technique in question comprises applying the thermally stabilizing material in the form of atomized droplets generated from a solution of the material using an ultrasonic nozzle and allowing the droplets to fall under gravity on to the photoresist image layer supported on a substrate. However, even the use of this technique can give rise to problems in certain cases unless steps are taken to ensure that an excess of material is not allowed to build up in localized areas of the photoresist layer. This can be accomplished in a number of ways. Thus, if the ultrasonic nozzle is held in a stationary position located more or less centrally above the substrate so that the atomized droplets fall in a pattern which encompasses the whole surface of the photoresist layer it is necessary to control carefully the amount of material so applied so that a uniform film of said material is deposited on the photoresist image layer without buildup of excess amounts of material in localized areas such as channels and the like in the images.

In a preferred embodiment of the invention the undesirable buildup of excess amounts of the stabilizing material is avoided by keeping the ultrasonic nozzle and the photoresist layer in constant motion relative to each other throughout the coating operation. This can be achieved in any of a number of ways. For example, where the photoresist layer and substrate comprise a rectangular sheet the latter can be moved longitudinally at a preselected rate through the pattern of atomized droplets generated by an ultrasonic nozzle mounted overhead in an appropriate manner. Where such a sheet of photoresist layer on substrate has a width greater than the width of the droplet pattern generated by the ultrasonic head it may be necessary to make two or more passes of the sheet through the pattern in order to coat the total surface of the sheet. Alternatively the whole width of the sheet can be covered in a single pass by employing two or more ultrasonic nozzles mounted overhead and spaced apart by an appropriate distance one from the other. While the above methods have been described as having a stationary nozzle and a substrate layer which is moved relative to the nozzle it will be obvious to one skilled in the art that the same effect could be achieved by moving the nozzle at an appropriate rate while holding the photoresist layer and substrate in stationary position.

When the photoresist layer is present on a standard circular disc or wafer the relative movement of the ultrasonic nozzle and the disc or wafer is achieved advantageously by employing means such as that illustrated in FIG. 1. The latter shows in partial cross-section a wafer 2, provided with a layer of photoresist images on its upper surface, mounted on the turntable 4 of an automatic spin coating apparatus represented overall as 1. Turntable 4 is mounted on hollow stem 6 through which a vacuum is provided from a vacuum source (not shown) to hold wafer 2 in place on turntable 4. Stem 6 is supported in chuck 8 which can be rotated about its longitudinal axis at speeds up to about 7000 rpm by an electric motor (not shown). Casing 10 with inwardly inclined upper periphery 12 surrounds the turntable 4 and supported disc 2 and serves to collect and direct downwardly inside the casing any fluid spun off disc 2 during rotation thereof. Ultrasonic nozzle assembly 12 is mounted vertically above disc 2 and held in place by clamp 14 attached to horizontal arm 16 adjustably mounted on vertical support rod 18 the lower end of which (not shown) is attached to the frame (also not shown) of the automatic coating apparatus 1. Ultrasonic nozzle assembly 12 is provided with atomizing surface 20. A solution of thermally stabilizing material is fed through tube 22 to the nozzle assembly 12 and is dispensed from atomizing surface 20 as a spray 24 of atomized droplets which fall under gravity on to the surface of disc 2. As shown in FIG. 1 and more clearly in FIG. 2, which is a plan view taken from above and looking downwardly upon the apparatus shown in FIG. 1, the nozzle assembly 12 is mounted vertically at a location approximately above the mid-point of radius X of disc 2. The nozzle assembly 12 is located with the atomizing surface 20 at the appropriate height above the disc 2 such that the pattern 26 of droplets which is generated and which falls on the disc 2 is approximately circular and has a diameter corresponding to and coinciding with the radius X of said disc.

Figure 2:
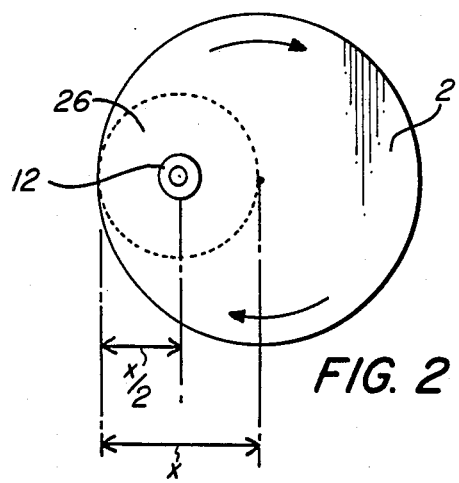
FIG. 2 is a plan view, taken from above, of the embodiment illustrated in FIG. 1.

In carrying out the process of the invention using the apparatus illustrated in FIGS. 1 and 2, the disc 2 is spun at a preselected speed generally in the range of about 300 rpm to about 4000 rpm and preferably in a range of about 300 rpm to about 800 rpm. Atomized droplets of solution of the thermally stabilizing agent are generated at atomizing surface 20 by operation of nozzle assembly 12 and allowed to fall under gravity on to the rotating surface of disc 2 until a predetermined amount of thermally stabilizing agent has been received on the photoresist layer of disc 2. The amount of agent so applied to the photoresist layer in any given instance is determined by a process of trial and error in the following manner. Thus, the rate at which droplets of solution are delivered by the atomizing surface 20 can be readily determined by observing the quantity of fluid which flows at a constant, controlled rate through the nozzle assembly 12 per unit of time when the assembly is not activated. A series of discs with identical patterns of photoresist images to be treated are then exposed over different periods of time at a constant spinning speed to the stream of atomized droplets. The so treated discs are thereafter taken through sufficient of the final steps of the fabrication of the microcircuitry to determine whether the coating of thermally stabilizing material has performed satisfactorily. The optimum time of exposure of the photoresist layer to the stream of atomized droplets, necessary to achieve satisfactory thermal stabilization free from the problems encountered with previous methods of application as discussed above, can be determined in this manner.

Figure 3:
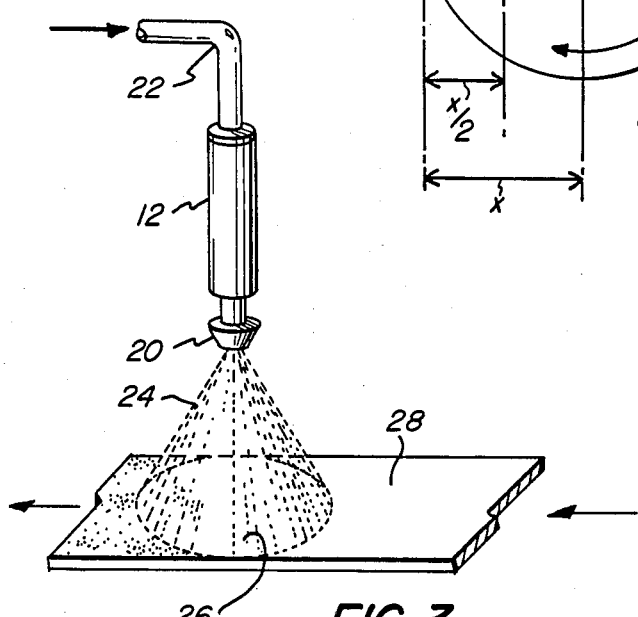
FIG. 3 is a perspective view illustrating another embodiment of a process in accordance with the invention.

In FIG. 3 is shown a perspective view of one means of carrying out the process of the invention when the photoresist layer to be treated is formed on a substantially rectangular substrate 28. In this embodiment the ultrasonic nozzle assembly 12 is mounted in fixed, stationary position above the substrate 28 at a height such that the pattern of droplets 24 being generated by atomizing surface 20 covers an area 26 which extends substantially across the whole width of substrate 28. While the droplets 24 are being generated the substrate 28 is moved laterally in the direction of the arrows at a predetermined rate. The optimum speed at which the substrate 28 is moved can be determined in any given instance by a process of trial and error. The minimum amount of thermally stabilizing agent required to be deposited on substrate 28 can be determined in the same manner as described above for the embodiment described in connection with the apparatus of FIGS. 1 and 2. In order to achieve the required amount of stabilizing agent deposited on the substrate 28 it may be necessary to repeat the process shown in FIG. 3 two or more times, if necessary, and optionally reversing the direction of movement after each pass through the descending pattern of atomized droplets.

The ultrasonic nozzle assembly 12 employed in the embodiments illustrated in FIGS. 1–3 can be any of those available commercially with flow rates in the desired range. Illustrative of such devices are those available under the trademark IMAGE-MAKER from Sono-Tek Corporation, 313 Main Mall, Poughkeepsie, N.Y. 12601 of which the Series 8605 is typical and those available from Solitec Inc., 1715 Wyatt Drive, Santa Clara, Calif. 95054. Such devices deliver atomized droplets in a size range of about 20–50 microns depending upon the frequency employed and have an infinitely variable flow rate from about 0 to about 40 gph (gallons per hour).

The example illustrates the process of the invention and the best mode known to the inventors of carrying out the same but is not to be construed as limiting.

EXAMPLE

A silicon wafer with approximately 10,000 Angstroms of aluminum over 1000 Angstroms of silicon dioxide was spun-coated at 5000 rpm with a high resolution, high contrast, high aspect-ratio positive photoresist system comprising a solvent blend solution of a novolak resin and a trihydroxybenzophenone ester of 2-diazo-1-oxonaphthoquinone-5-sulfonic acid [ULTRAMAC$^{TM}$ PR 914: MacDermid Inc., Waterbury, Connecticut]. The coated wafer was baked at 110° C. for 50 seconds on a wafer track hotplate over to evaporate the solvents from the coating before being exposed through a submicron geometry mask to UV light in a broad band contact exposure mode using a Perkin Elmer Micralign 300 printer. The resulting coating had an average thickness of 2.0 microns. The exposed photoresist was developed using an alkaline developer [ULTRAMAC MF-28: MacDermid, Inc.] to give an image of high resolution with walls approaching 90 degrees. A film of hydrolyzed gelatin was then applied to the image layer using a procedure in accordance with the invention as illustrated in FIG. 1. The wafer was mounted on the table of a conventional wafer coat/developer track machine. An IMAGE-MAKER$^{TM}$ ultrasonic spray nozzle Series 8605 (Sono-tek Corporation: ibid) was mounted about 2 inches above the wafer and about halfway between the center and periphery of the wafer. A solution containing 15 g/liter of non-gelling gelatin hydrolyzate [Hydrolyzed Type B gelatin: M.W Ca 2000: Peter Copper Corp., Oak Creek, Wisconsin] was fed to the nozzle at a rate adjusted so that 1 drip/second emerged from the nozzle prior to actuating the latter. The disc was rotated at a speed of 400 rpm while atomized droplets of the hydrolyzed gelatin solution were dispensed under gravity from the atomizing surface of the nozzle for a time of 45 seconds using a power setting of 2.5. The film so deposited on the wafer dried during the spinning operation. After rinsing and drying, the coated wafer was subjected to a plasma treatment under the following conditions:

Plasma chamber: XYLIN Model ZN20
Gas mixture: $SiCl_4$ at 80 SCCM $CHCl_3$ at 20 SCCM $Cl_2$ at 60 SCCM $N_2$ at 150 SCCM
Pressure: 250 millitorr
RF Power: 550 watts
Temperature at Wafer: 35° C.
Time: 85 seconds Inspection of the resulting image using a scanning electron microscope showed no significant distortion or other loss of integrity of the walls of the image.

The above procedure was repeated exactly as described except that the hydrolyzed gelatin was applied by spin coating using the same apparatus as described above except that the solution of the gelatin was flooded on to the wafer while the latter was spun at 3000 rpm. After the final plasma treatment it was found that the coated image had suffered significant distortion at a number of locations and the geometry of the circuity was impaired significantly.

What is claimed is:

1. In a process for thermally stabilizing a resist image supported on a substrate by coating said image with a film of a thermally stabilizing material comprising an aqueous solution of gelatin or non-gelling hydrolyzed gelatin the improvement which comprises applying said stabilizing material in a predetermined amount in the form of a pattern of atomized droplets generated using an ultrasonic nozzle and falling under gravity from said nozzle.

2. A process according to claim 1 wherein said nozzle and said image supported on said substrate are being moved relative to each other during the application of the stabilizing material.

3. A process in accordance with claim 2, wherein said image and substrate are rotated in a horizontal plane and said ultrasonic nozzle is disposed above said plane in a position located eccentrically with respect to the axis of rotation of said image and substrate.

4. A process in accordance with claim 3, wherein said substrate is a substantially circular disc and said nozzle is mounted above said disc at a location substantially midway between the center and the perimeter of said disc.

5. A process in accordance with claim 2 wherein said substrate is moved at a predetermined speed along a substantially longitudinal path in a horizontal plane through said pattern of atomized droplets.

* * * * *